(12) United States Patent
Ranjan et al.

(10) Patent No.: US 7,692,486 B2
(45) Date of Patent: Apr. 6, 2010

(54) CONFIGURABLE FEEDBACK FOR AN AMPLIFIER

(75) Inventors: Mahim Ranjan, La Jolla, CA (US); Li Liu, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 13 days.

(21) Appl. No.: 11/868,159

(22) Filed: Oct. 5, 2007

(65) Prior Publication Data

US 2009/0091391 A1  Apr. 9, 2009

(51) Int. Cl.
 *H03F 1/08* (2006.01)
(52) U.S. Cl. .................. 330/86; 330/293; 330/291
(58) Field of Classification Search .................. 330/86, 330/293, 291
See application file for complete search history.

(56) References Cited

U.S. PATENT DOCUMENTS

| 4,249,261 | A |   | 2/1981  | Ogita |   |
|-----------|---|---|---------|-------|---|
| 4,450,413 | A | * | 5/1984  | Fujibayashi | ................. 330/279 |
| 6,140,878 | A | * | 10/2000 | Masuta | ....................... 330/308 |
| 6,232,834 | B1 | * | 5/2001 | Zheng | ........................ 330/107 |
| 7,268,628 | B2 | * | 9/2007 | Noda | .......................... 330/308 |
| 7,389,056 | B2 | * | 6/2008 | Kunii et al. | ................. 398/209 |

FOREIGN PATENT DOCUMENTS

| JP | 03-187609 | 8/1991 |
| JP | 01-311612 | 7/2009 |
| WO | 03063338 | 7/2003 |
| WO | 06103380 | 10/2006 |

OTHER PUBLICATIONS

Malmqvist, R. et al.: "RF MEMS and GaAs Based Reconfigurable RF Front-End Components for Wide-Band Multi-Functional Phased Arrays," Microwave Conference, 2006. 36th European, IEEE, PI, Sep. 1, 2006 pp.1798-1801, XP031005953.
International Search Report, PCT/US2008/078819—International Search Authority—European Patent Office, Dec. 10, 2008.
Written Opinion, PCT/US2008/078819—International Search Authority—European Patent Office, Dec. 10, 2008.

* cited by examiner

*Primary Examiner*—Patricia Nguyen
(74) *Attorney, Agent, or Firm*—William M Hooks

(57) ABSTRACT

An amplifier is disclosed that includes configurable feedback based on the output of a received signal strength indicator. The feedback may be increased for high received signal levels, and decreased for low received signal levels. In an embodiment, the configurable impedance may comprise a plurality of discrete impedance settings. Amplitude and/or time hysteresis may be incorporated.

24 Claims, 9 Drawing Sheets

CONFIGURABLE FEEDBACK FOR AN AMPLIFIER

TECHNICAL FIELD

The disclosure relates to communications receivers and, more particularly, to techniques for improving noise figure and linearity of amplifiers such as low noise amplifiers.

BACKGROUND

In a communication system, a transmitter modulates a signal onto a radio frequency (RF) carrier, and transmits the signal to a receiver over a communication channel. At the receiver, a low-noise amplifier (LNA) typically amplifies the received signal (which may include the desired signal, noise, and undesired jammers) and provides the amplified signal to later receiver stages for processing. LNAs are usually designed to have a low noise figure to amplify low level desired signals without introducing excessive noise. On the other hand, when the strength of the desired signal and/or the jammer is high, it is desirable for the LNA to have good linearity, or low distortion, so that the jammers do not corrupt the desired signal. The design goals of low noise figure and good linearity are often conflicting, and a single LNA design must often trade off one for the other.

It would be desirable to automatically determine preferred operating characteristics for an amplifier such as an LNA, and dynamically adjust the amplifier's parameters during operation to optimally trade off noise figure for linearity.

SUMMARY

An aspect of the present disclosure provides an amplifier for amplifying an input signal to generate an output signal, the amplifier comprising a negative feedback element for coupling the output signal to the input signal to generate a modified input signal, the feedback element comprising a configurable impedance; a gain element for providing gain to the modified input signal, the output of the gain element coupled to the output signal; and a signal strength detection element for measuring the level of a signal derived from the output signal, the output of the signal strength detection element coupled to the feedback element to control the configurable impedance in response to the signal level measured by the signal strength detection element.

Another aspect of the present disclosure provides an amplifier for amplifying an input signal to generate an output signal, the amplifier comprising a feedback element for coupling the output signal to the input signal to generate a modified input signal, the feedback element comprising a configurable impedance; a gain element for providing gain to the modified input signal, the output of the gain element coupled to the output signal; and a signal strength detection element for measuring the level of a signal derived from the input signal, the output of the signal strength detection element coupled to the feedback element to control the configurable impedance in response to the signal level measured by the signal strength detection element.

Yet another aspect of the present disclosure provides a method for amplifying an input signal to generate an output signal, the method comprising coupling the output signal to the input signal using negative feedback via a configurable impedance, the coupled signals generating a modified input signal; providing gain to the modified input signal; measuring the level of a signal derived from the output signal; and controlling the impedance of the configurable impedance in response to the measured signal level.

Yet another aspect of the present disclosure provides an amplifier for amplifying an input signal to generate an output signal, the amplifier comprising means for coupling the output signal to the input signal with configurable impedance to generate a modified input signal; means for providing gain to the modified input signal; and signal strength detection means for measuring the level of a signal derived from the output signal, the output of the signal strength detection means coupled to the means for coupling the output signal to the input signal to control the configurable impedance.

BRIEF DESCRIPTION OF DRAWINGS

FIG. 6 shows an embodiment wherein a Schmitt trigger 202S.1 implements amplitude hysteresis to generate control signal 203a.

DETAILED DESCRIPTION

Figure 1:
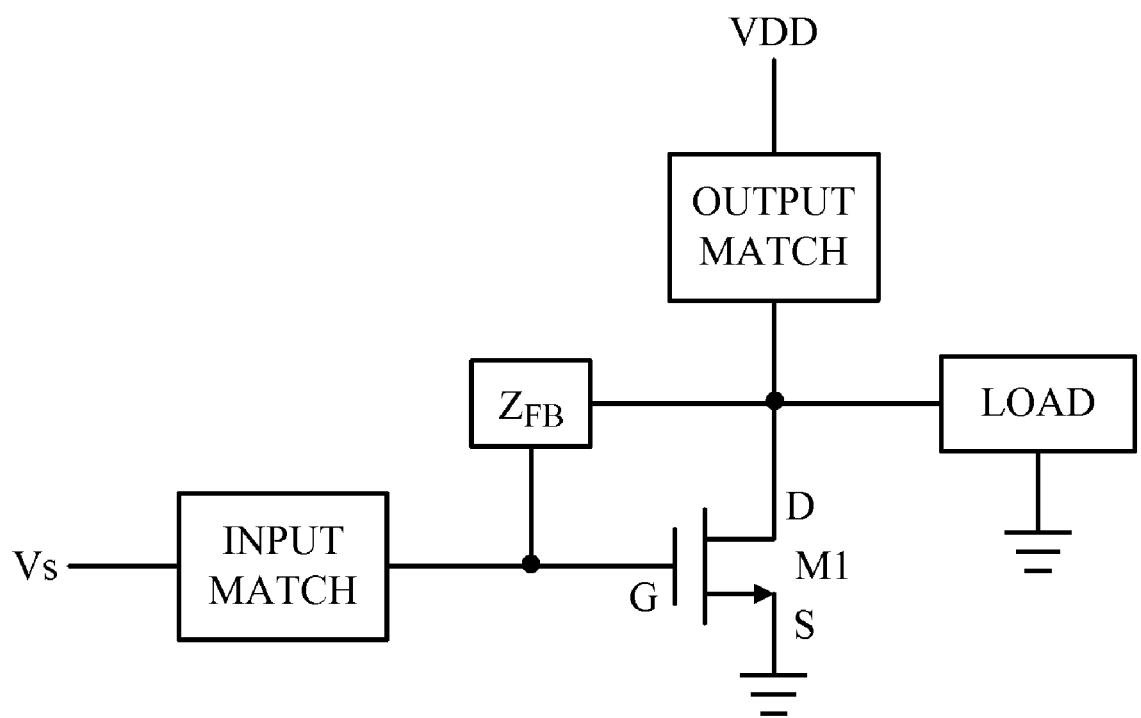
FIG. 1 shows a conventional circuit topology for an LNA.

FIG. 1 shows a conventional circuit topology for an LNA. In FIG. 1, a source voltage Vs is coupled to the gate (G) of transistor M1 via an input match. The drain (D) of transistor M1 is coupled to an output match and a load. The circuit effectively provides gain to an input signal (Vs) to generate an output signal (the drain voltage) via a gain element (transistor M1).

To improve the linearity of the LNA, shunt feedback of impedance $Z_{FB}$ is provided from the drain (D) to the gate (G). The feedback may be a series RC network, or any other network. The feedback couples the output signal (the drain voltage) to the input signal (Vs) to generate a modified input signal (the gate voltage) for the gain element (transistor M1).

Note that while feedback generally improves the linearity of the LNA, it may also reduce gain and add noise, thereby degrading the noise figure of the LNA. An aspect of the present disclosure provides for configuring the amount of feedback based on a level of signal detected.

Figure 2:
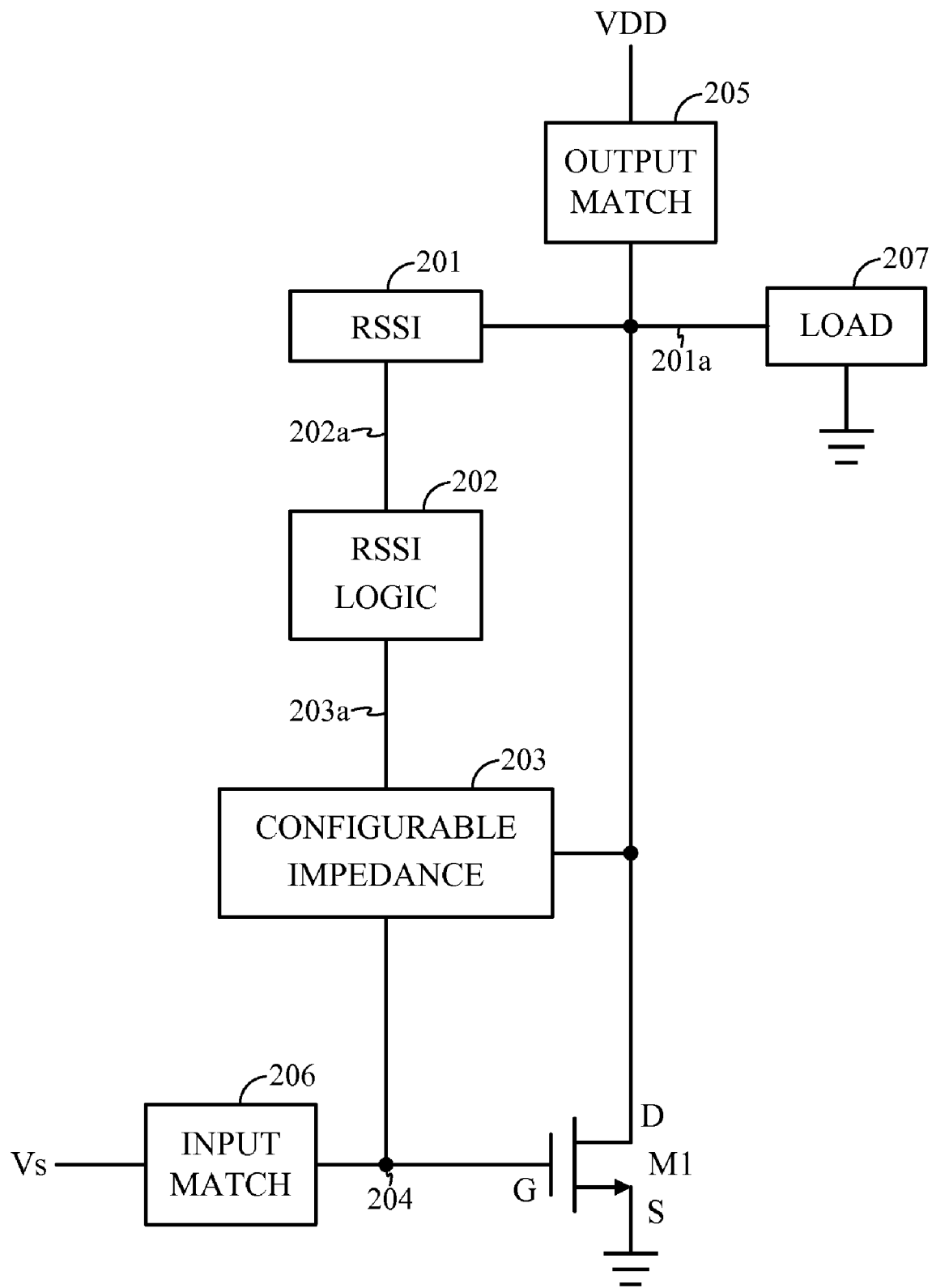
FIG. 2 shows an embodiment of an LNA with shunt feedback having configurable impedance according to an embodiment of the present disclosure.

FIG. 2 shows an embodiment of an LNA with shunt feedback having configurable impedance according to an embodiment of the present disclosure. In FIG. 2, the drain voltage 201a of transistor M1 is coupled to a received signal strength indicator (RSSI) block 201. The RSSI 201 measures the amplitude (or other level indicator) of the drain voltage 201*a*, and produces an RSSI signal 202*a* proportional thereto. The RSSI signal 202*a* is coupled to RSSI logic block 202, which outputs a control signal 203*a* dependent on the level of RSSI signal 202*a*. Control signal 203*a* is input to the configurable impedance block 203 to control the variable impedance $Z_{config}$ of configurable impedance block 203. In an embodiment wherein shunt feedback is utilized, the variable impedance $Z_{config}$ is varied inversely to the signal level measured by RSSI 201, so that $Z_{config}$ has greater impedance when the measured signal is low, and lesser impedance when the measured signal is high. This is advantageous as the better linearity afforded by greater feedback (or lesser impedance for shunt feedback) is generally preferred when the received signal is strong, whereas the higher gain corresponding to less feedback (or higher impedance for shunt feedback) is generally preferred when the received signal is weak.

Note that in the design of FIG. 2, the RSSI block 201 may be designed to have high input impedance compared to the load. The loading of the RSSI block 201 on the drain of transistor M1 may be factored into the design of the output match 205.

Figure 3:
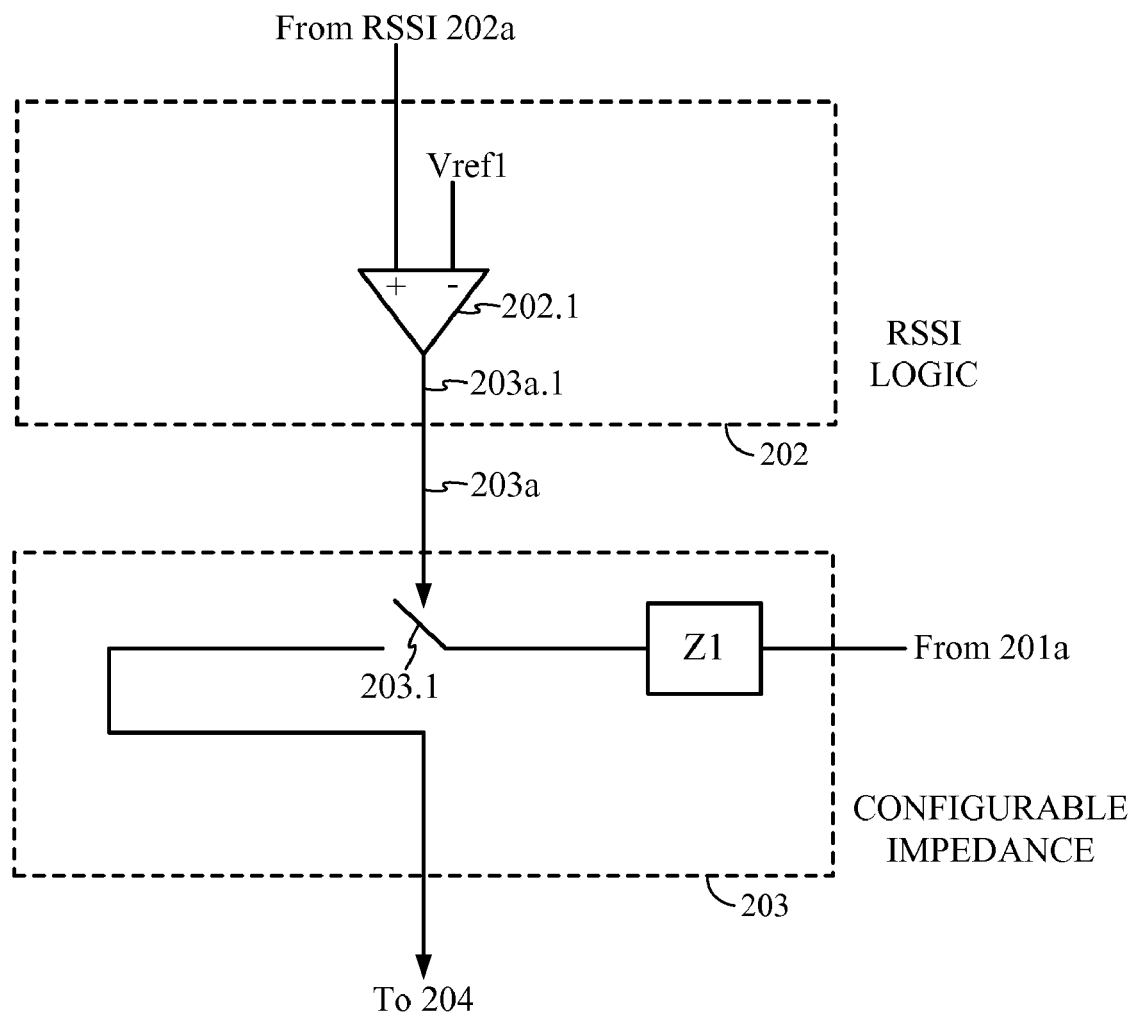
FIG. 3 shows an embodiment of RSSI logic block 202 and configurable impedance block 203.

In an embodiment, control signal 203*a* may include one or a plurality of activation signals for controlling a switch or a plurality of switches inside configurable impedance block 203. FIG. 3 shows an embodiment of RSSI logic block 202 and configurable impedance block 203. In FIG. 3, control signal 203*a* includes one activation signal 203*a*.1 for controlling one switch 203.1. In the embodiment shown, activation signal 203*a*.1 is generated by comparator 202.1. Comparator 202.1 compares the amplitude of the RSSI signal 202*a* with a reference signal Vref1. Comparator 202.1 outputs a high level for 203*a*.1 if 202*a* is greater than reference signal Vref1, and a low output level for 203*a*.1 if 202*a* is less than reference signal Vref1. In an embodiment, a high output level can be 1.5 volts or higher, while a low output level can be 0.8 volts or lower.

In an embodiment, a high output level for signal 203*a*.1 closes switch 203.1, while a low output level for signal 203*a*.1 opens switch 203.1. It can be seen that when switch 203.1 is open, the configurable impedance block 203 is effectively an open circuit between nodes 201 and 204, i.e., there is no shunt feedback in the LNA. Alternatively, when switch 203.1 is closed, the configurable impedance block 203 has impedance Z1. The embodiment shown thus provides for shunt feedback of impedance Z1 when the LNA output signal 201*a* is above reference level Vref1, and for no shunt feedback when the LNA output signal 201*a* is below reference level Vref1. In an embodiment, Vref1 is 250 mV.

Note other embodiments may provide for two different levels of shunt feedback rather than for feedback vs. no feedback. For example, in an embodiment, 800 Ohms of shunt feedback may be provided when the LNA output signal 201 is below a reference level, and 2800 Ohms of shunt feedback may be provided when the LNA output signal 201 is above the reference level. The circuitry for such an implementation is realizable by those of ordinary skill in the art, and will not be described further herein.

Figure 4:
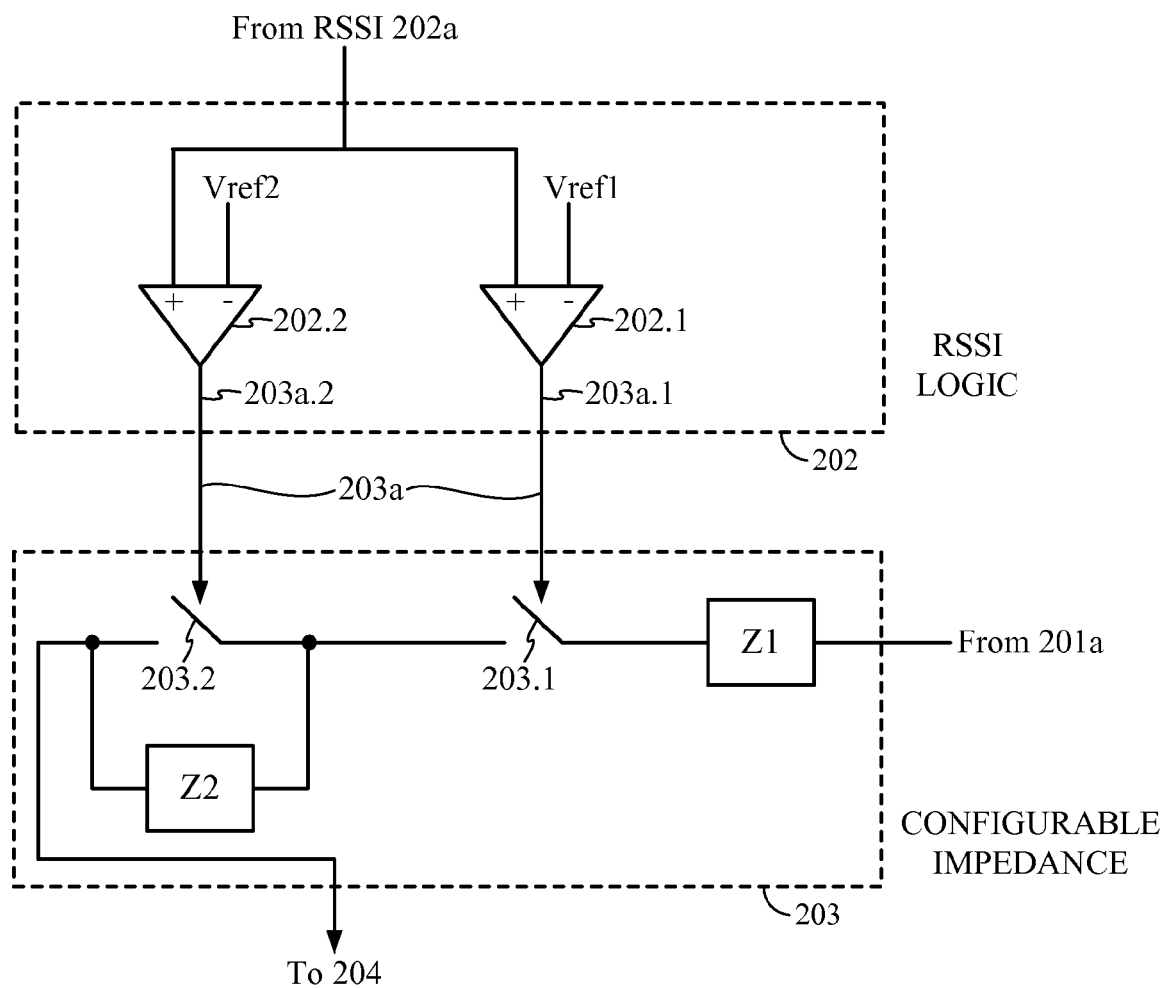
FIG. 4 shows an embodiment wherein control signal 203a includes two activation signals 203a.1 and 203a.2 for controlling two switches 203.1 and 203.2, respectively.

In an embodiment, control signal 203*a* may include more than one activation signal for controlling more than one switch in the configurable impedance block 203. FIG. 4 shows an embodiment wherein control signal 203*a* includes two activation signals 203*a*.1 and 203*a*.2 for controlling two switches 203.1 and 203.2, respectively. Activation signals 203*a*.1 and 203*a*.2 are generated by comparators 202.1 and 202.2, respectively. The comparators 202.1 and 202.2 compare the RSSI signal 202*a* with reference signals Vref1 and Vref2, respectively. In an embodiment, Vref2 is greater than Vref1.

When the RSSI signal 202*a* is less than both Vref1 and Vref2, then both switches 203.1 and 203.2 are open. In this case, there is no feedback from the drain to the gate of transistor M1 in FIG. 2. When the RSSI signal 202*a* is greater than Vref1 but less than Vref2, switch 203.1 is closed, while switch 203.2 is open. In this case, the feedback from the drain to the gate of transistor M1 has impedance Z1+Z2. Finally, when the RSSI signal 202*a* is greater than both Vref1 and Vref2, both switches 203.1 and 203.2 are closed. In this case, the feedback from the drain to the gate of transistor M1 has impedance Z1. Thus the shunt feedback shown in FIG. 4 is seen to increase (i.e., impedance decreases) in discrete steps with increasing levels of the RSSI signal 202*a*.

The techniques discussed above for one and two reference levels may readily be extended to allow the RSSI logic 202 and configurable impedance block 203 to accommodate more than two reference levels. For example, additional comparators may be added in the RSSI logic 202, and additional switch and impedance pairs may be added in series after the switch and impedance pair 203.2/Z2 in FIG. 4. Such modifications can be readily derived by those of ordinary skill in the art of circuit design, and are contemplated to be within the scope of the present disclosure.

Figure 5:
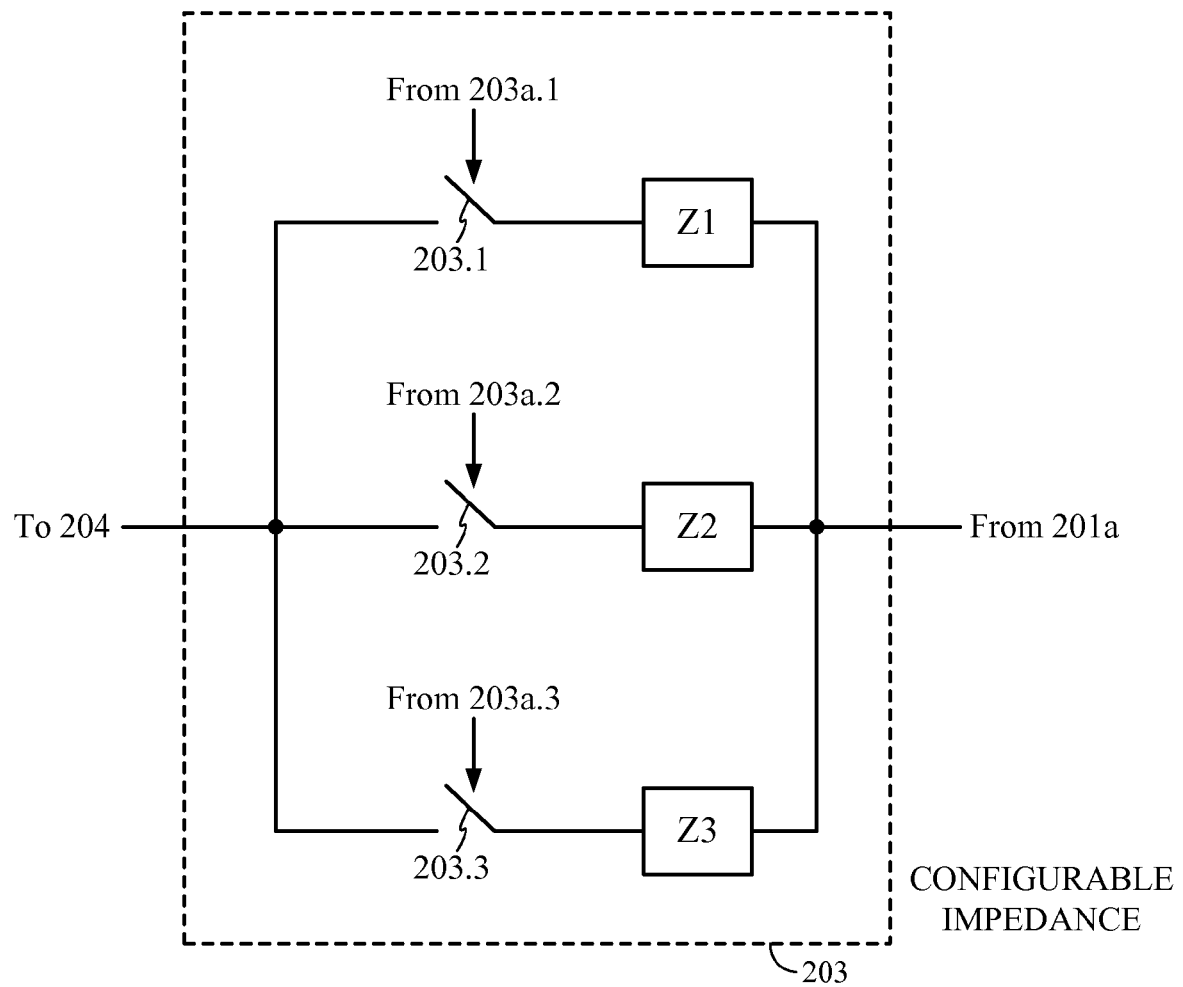
FIG. 5 depicts an embodiment of the configurable impedance block 203 having three switches 203.1, 203.2, and 203.3 controlled by three control signals 203a.1, 203a.2, and 203a.3, respectively.

In addition, alternative implementations of configurable impedance block 203 are also contemplated and within the scope of the present disclosure. For example, a switch and impedance can be connected in series to form a pair, and multiple pairs can be connected in parallel to form a configurable impedance block, as shown in FIG. 5. FIG. 5 depicts an embodiment of the configurable impedance block 203 having three switches 203.1, 203.2, and 203.3 controlled by three control signals 203*a*.1, 203*a*.2, and 203*a*.3, respectively (generation of control signals not shown). Other implementations can also be readily derived by those of ordinary skill in the art of circuit design.

Note the relationship of the control signal 203*a* to the action of the switches need not be as described above. For example, in alternative embodiments, a high level of control signal 203*a* may open rather than close switches in the configurable impedance block 203. Various other modifications to the circuitry described will be clear to those of ordinary skill in the art, and such modifications are contemplated to be within the scope of the present disclosure.

In certain scenarios, transient fluctuations in the RSSI signal 202*a* may cause undesirable switching of the switches in configurable impedance block 203. In an embodiment, the RSSI logic 202 may incorporate amplitude and/or time hysteresis in one or more comparators to reduce such undesirable switching.

Figure 6:
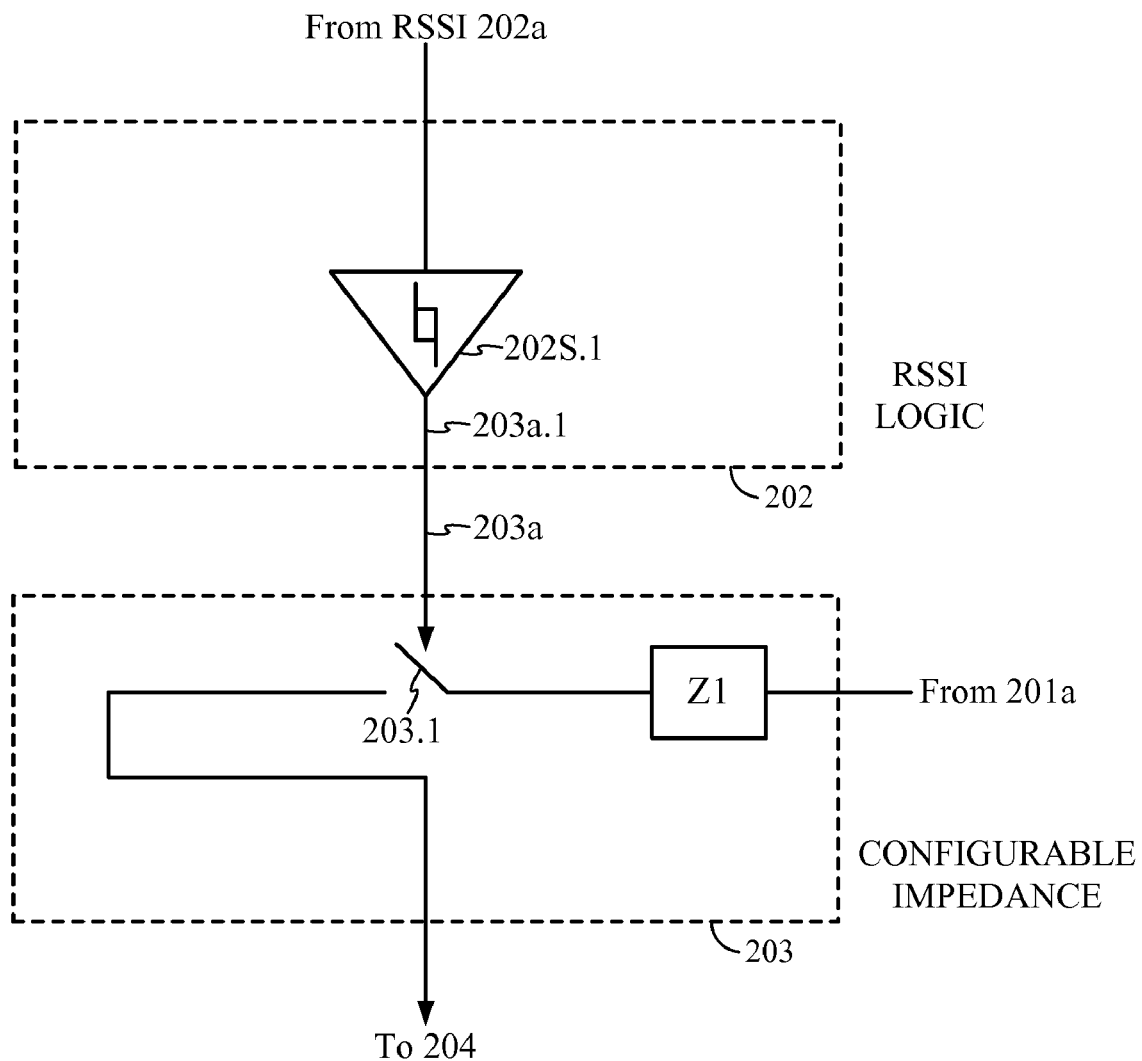

FIG. 6 shows an embodiment wherein a Schmitt trigger 202S.1 implements amplitude hysteresis to generate control signal 203*a*. The Schmitt trigger 202S.1 may be pre-set to have two thresholds Vref1_plus and Vref1_minus (not shown in FIG. 6), wherein Vref1_plus is greater than Vref1_minus. According to this embodiment, if the control signal 203*a* is low, then the switching threshold will be Vref1_plus, whereas if the control signal 203*a* is high, the switching threshold will be Vref1_minus. This embodiment prevents the control signal 203*a* from continually responding to small-scale amplitude variations in the RSSI output 202*a*. The design of Schmitt triggers is well-known in the art, and will not be described further herein.

Figure 6A:
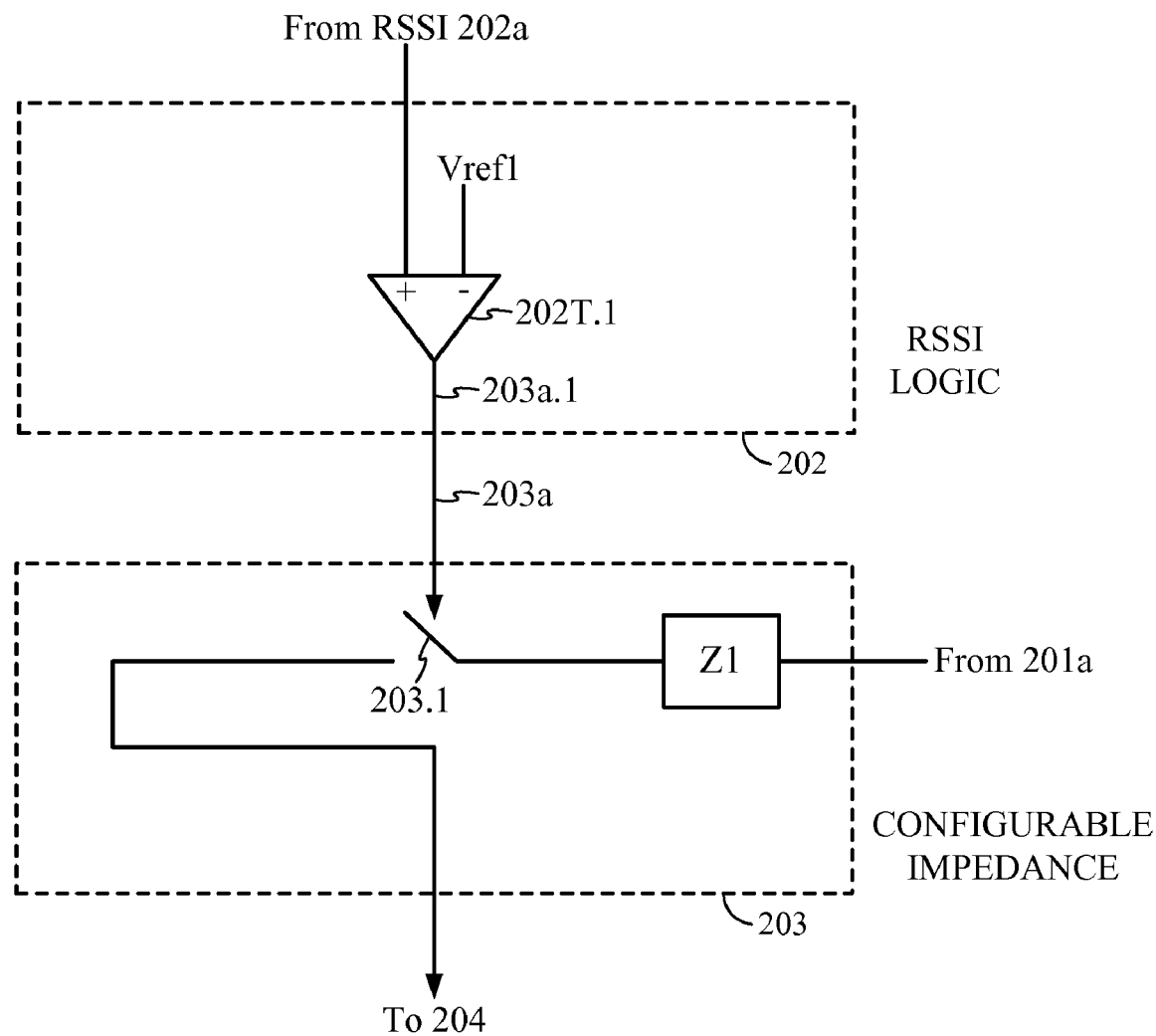
FIG. 6A depicts an embodiment of RSSI logic block 202 employing time hysteresis in a comparator 202T.1.

Alternatively, or in conjunction with amplitude hysteresis, time hysteresis may be incorporated in the RSSI logic block 202. FIG. 6A depicts an embodiment of RSSI logic block 202 employing time hysteresis in a comparator 202T.1. Under time hysteresis, the output 203a.1 of the comparator 202T.1 is not allowed to transition between levels until a predetermined period of time has passed, and some other criteria related to the amplitude of RSSI output 202a have been satisfied. In an embodiment, the criteria comprises the condition that the amplitude level have exceeded (for an upward transition of the output) or remained less than (for a downward transition) the threshold level during all or some portion of the predetermined period of time. The time hysteresis circuitry may be designed into the comparator 202T.1, or it may be provided as a separate block (not shown). Note that circuitry for implementing such time hysteresis will be clear to those of ordinary skill in the art, and will not be discussed further herein.

In an embodiment, time hysteresis may be selectively introduced for only some of the transitions in the detected amplitude level. For example, time hysteresis may be employed when the detected amplitude level drops below the threshold level, while time hysteresis need not be employed when the detected amplitude level goes above the threshold level.

Note the configurable impedance block 203 need not be limited to implementations wherein the impedance is configurable in discrete steps. A varactor with continuously variable impedance may also be used within the scope of the present disclosure. Such an implementation may utilize a control signal 203a continuously proportional to the output of the RSSI block 201 to control the impedance of the varactor. In this embodiment, the RSSI logic block 202 may be bypassed.

Figure 7:
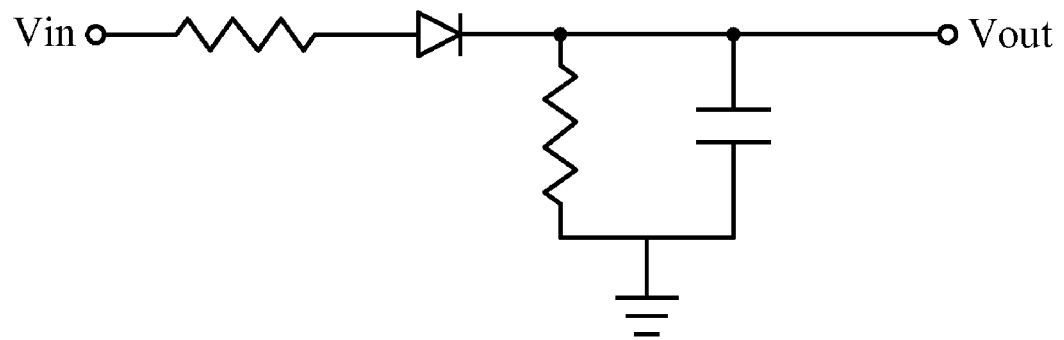
FIG. 7 depicts an embodiment of the RSSI block 201.

FIG. 7 depicts an embodiment of the RSSI block 201. In the embodiment of FIG. 7, a simple diode detector is used to detect the low-frequency envelope of an incoming signal Vin. The output Vout of the diode detector follows the amplitude of Vin. In an embodiment, the 3-dB bandwidth of the RC circuit is 30 MHz.

Figure 8:
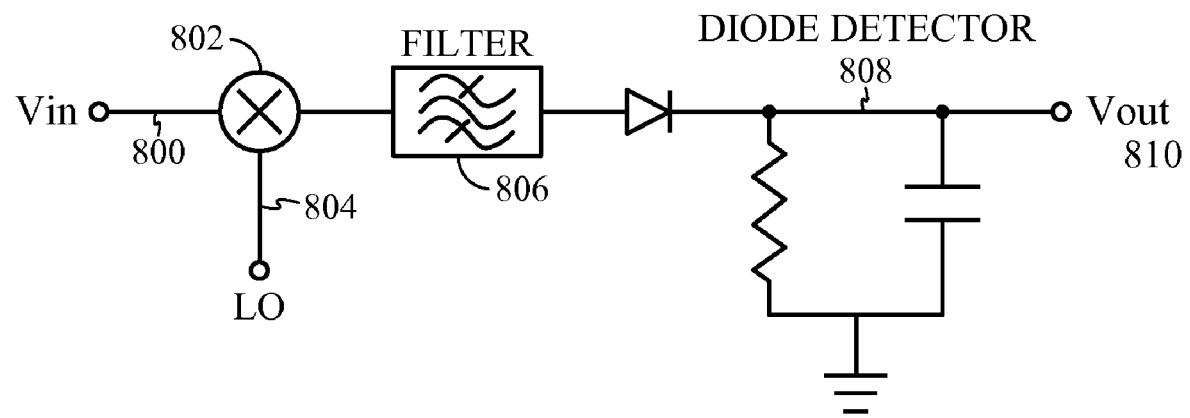
FIG. 8 depicts an alternative embodiment of the RSSI block 201. The embodiment of FIG. 8 provides for frequency-selective estimation of the signal of interest.

FIG. 8 depicts an alternative embodiment of the RSSI block 201. The embodiment of FIG. 8 provides for frequency-selective estimation of the signal of interest. In the embodiment shown, a mixer 802 is coupled to the input signal Vin 800. In an embodiment, the frequency of a local oscillator (LO) 804 can be tuned to the frequency of the desired signal component in Vin 800, thus translating the desired signal to baseband at the output of the mixer 802. The mixer output may then be provided to a filter 806. In an embodiment, filter 806 may be a high-pass filter that removes the low-frequency components associated with the desired signal translated to baseband, and leaves only the high-frequency components associated with possible jammers. The envelope of the high-frequency components are then detected by diode detector 808, and provided as output signal 810. It will be understood that the combination of mixer 802 and high-pass filter 806 behaves as a band-reject filter to filter out the desired signal component in Vin 800. The frequency-selective RSSI shown in FIG. 8 may thus control configurable impedance 203 in FIG. 2 based only on the strength of the jammer portion of the signal. This may improve the noise figure of the LNA, as the gain of the LNA need not be reduced by feedback when a received signal is composed predominantly of the desired signal.

In a further embodiment according to the present disclosure, the RSSI may be configured to measure the signal strength at the gate rather than at the drain of transistor M1 in FIG. 2. In an embodiment, the input to the RSSI may be taken from the gate voltage 204 of transistor M1. Note this design may result in lesser LNA gain than the embodiment depicted in FIG. 2, as the RSSI 201 would effectively load the LNA input rather than output. In an alternative embodiment not shown, the input of the RSSI may be taken directly from Vs, i.e., prior to the input match 206.

Figure 9:
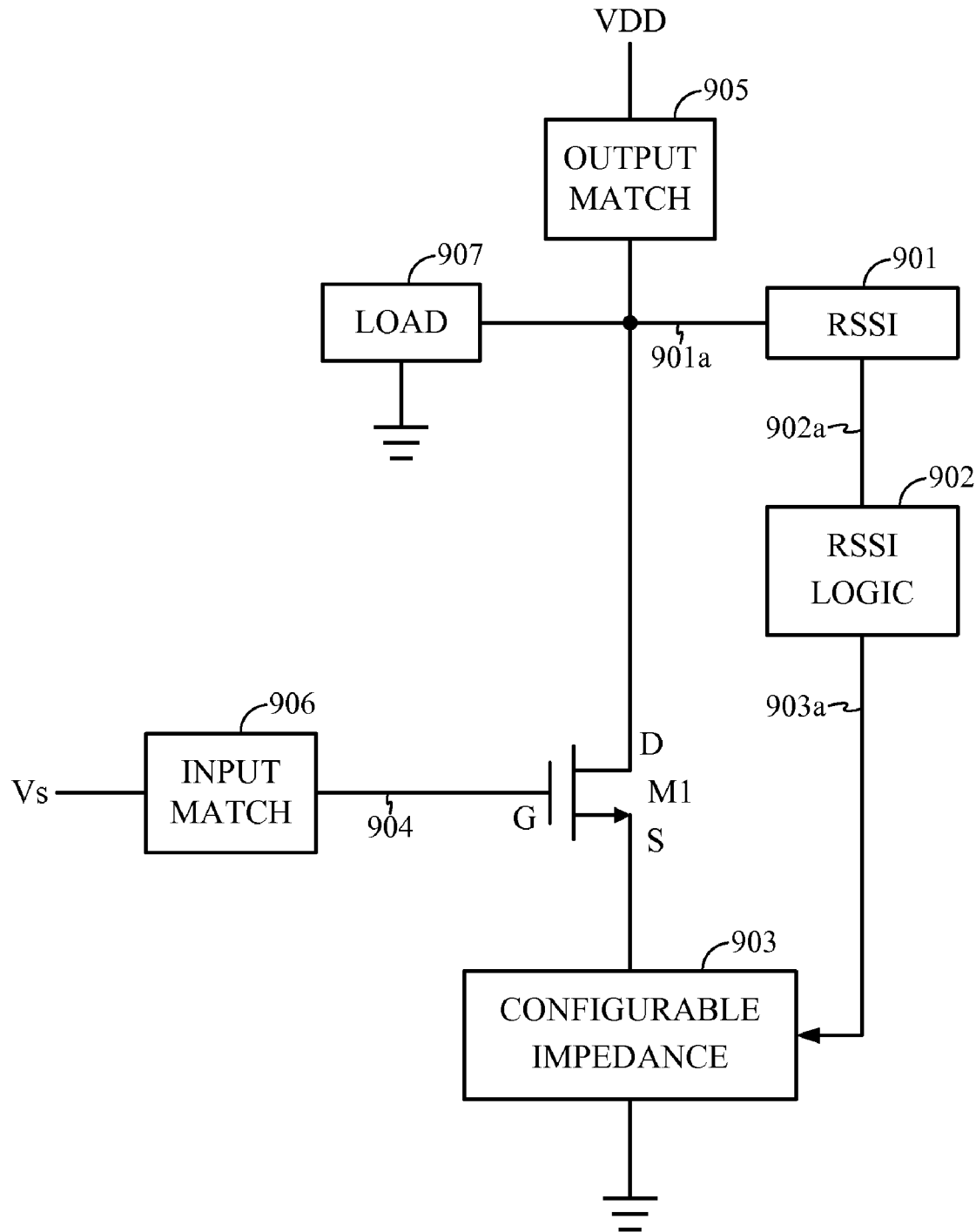
FIG. 9 depicts an LNA incorporating series feedback 903 at the source of transistor M1, wherein the series feedback is configurable according to the techniques of the present disclosure.

Note the techniques disclosed herein need not be restricted to LNA's incorporating shunt feedback. Any type of feedback may be made configurable according to techniques of the present disclosure. For example, FIG. 9 depicts an LNA incorporating series feedback 903 at the source (S) of transistor M1, wherein the series feedback is configurable according to the techniques of the present disclosure. Note since greater impedance is equivalent to greater feedback for the series feedback scheme shown in FIG. 9, the corresponding RSSI logic block 902 and configurable impedance block 903 will need to be modified from the embodiments described earlier for shunt feedback. Such modifications are clear to those of ordinary skill in the art, and are contemplated to fall within the scope of the present disclosure.

Note that while the techniques herein have been described with reference to a low-noise amplifier utilizing the basic topology of FIG. 1, the techniques need not be limited to such amplifier topologies. For example, an operational amplifier including multiple transistors may be used as the gain element. The techniques described herein apply to differential signals as well as single-ended signals.

Based on the teachings described herein, it should be apparent that an aspect disclosed herein may be implemented independently of any other aspects and that two or more of these aspects may be combined in various ways. For example, specific embodiments disclosed for the RSSI logic and configurable impedance block may be implemented exclusively of or in conjunction with specific embodiments disclosed for the RSSI block.

The techniques described herein may be implemented in hardware, software, firmware, or any combination thereof. If implemented in hardware, the techniques may be realized using digital hardware, analog hardware or a combination thereof. For example, the RSSI logic block may be implemented in the digital domain by digitizing the analog RSSI output using a digital to analog converter (DAC). If implemented in software, the techniques may be realized at least in part by a computer-program product that includes a computer readable medium on which one or more instructions or code is stored.

By way of example, and not limitation, such computer-readable media can comprise RAM, such as synchronous dynamic random access memory (SDRAM), read-only memory (ROM), non-volatile random access memory (NVRAM), ROM, electrically erasable programmable read-only memory (EEPROM), erasable programmable read-only memory (EPROM), FLASH memory, CD-ROM or other optical disk storage, magnetic disk storage or other magnetic storage devices, or any other tangible medium that can be used to carry or store desired program code in the form of instructions or data structures and that can be accessed by a computer.

The instructions or code associated with a computer-readable medium of the computer program product may be executed by a computer, e.g., by one or more processors, such as one or more digital signal processors (DSPs), general purpose microprocessors, ASICs, FPGAs, or other equivalent integrated or discrete logic circuitry.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

A number of aspects and examples have been described. However, various modifications to these examples are possible, and the principles presented herein may be applied to other aspects as well. These and other aspects are within the scope of the following claims.

The invention claimed is:

1. An amplifier for amplifying an input signal to generate an output signal, the amplifier comprising:
   a negative feedback element for coupling the output signal to the input signal to generate a modified input signal, the feedback element comprising a configurable impedance;
   a gain element for providing gain to the modified input signal, the output of the gain element coupled to the output signal; and
   a signal strength detection element for measuring the level of the output signal, the output of the signal strength detection element coupled to the feedback element to increase feedback from the output signal to the input signal in response to increased measured output signal level.

2. An amplifier for amplifying an input signal to generate an output signal, the amplifier comprising:
   a negative feedback element for coupling the output signal to the input signal to generate a modified input signal, the feedback element comprising a configurable impedance;
   a gain element for providing gain to the modified input signal, the output of the gain element coupled to the output signal; and
   a signal strength detection element for measuring the level of a signal derived from the output signal, the output of the signal strength detection element coupled to the feedback element to control the configurable impedance in response to the signal level measured by the signal strength detection element, the signal derived from the output signal being a band-reject filtered version of the output signal.

3. The amplifier of claim 1, the gain element comprising a transistor, the drain voltage of the transistor being the output signal, the gate voltage of the transistor being the modified input signal.

4. The amplifier of claim 3, the amplifier further comprising a logic element coupled to the output of the signal strength detection element, the output of the logic element coupled to the feedback element to control the configurable impedance.

5. The amplifier of claim 4, the logic element comprising a first comparator for comparing the output signal of the signal strength detection element to a first reference voltage.

6. The amplifier of claim 5, the configurable impedance comprising a first impedance element coupled to a first switch, the first switch controlled by a control signal coupled to the output of the first comparator.

7. The amplifier of claim 6, the first switch coupled in series with the first impedance element, the first switch being closed in response to the output signal of the signal strength detection element being greater than the first reference voltage, and the first switch being open in response to the output signal of the signal strength detection element being less than the first reference voltage.

8. The amplifier of claim 7, the logic element further comprising a second comparator for comparing the output signal of the signal strength detection element to a second reference voltage, the configurable impedance further comprising a second impedance element coupled in parallel with a second switch, the second impedance element and the second switch coupled in series with the first switch and the first impedance element, the second switch controlled by a control signal coupled to the output of the second comparator, the second switch being closed in response to the output signal of the signal strength detection element being greater than the second reference voltage, and the second switch being open in response to the output signal of the signal strength detection element being less than the second reference voltage.

9. The amplifier of claim 7, the logic element further comprising a second comparator for comparing the output signal of the signal strength detection element to a second reference voltage, the configurable impedance further comprising a second impedance element coupled in series with a second switch, the second impedance element and the second switch coupled in parallel with the first impedance element and the first switch, the second switch controlled by a control signal coupled to the output of the second comparator, the second switch being closed in response to the output signal of the signal strength detection element being greater than the second reference voltage, and the second switch being open in response to the output signal of the signal strength detection element being less than the second reference voltage.

10. The amplifier of claim 5, the first comparator incorporating amplitude hysteresis.

11. The amplifier of claim 5, the first comparator incorporating time hysteresis.

12. An amplifier for amplifying an input signal to generate an output signal, the amplifier comprising:
    a negative feedback element for coupling the output signal to the input signal to generate a modified input signal, the feedback element comprising a configurable impedance;
    a gain element for providing gain to the modified input signal, the output of the gain element coupled to the output signal; and
    a signal strength detection element for measuring the level of the output signal, the output of the signal strength detection element coupled to the feedback element to control the configurable impedance in response to the signal level measured by the signal strength detection element, the amplifier farther comprising a logic element coupled to the output of the signal strength detection element, the output of the logic element coupled to the feedback element to control the configurable impedance, the logic element comprising a first comparator for comparing the output signal of the signal strength detection element to a first reference voltage, the first comparator incorporating time hysteresis only on a downward transition in the output of the signal strength detection element.

13. An amplifier for amplifying an input signal to generate an output signal, the amplifier comprising:
    a negative feedback element for coupling the output signal to the input signal to generate a modified input signal, the feedback element comprising a configurable impedance;
    a gain element for providing gain to the modified input signal, the output of the gain element coupled to the output signal; and
    a signal strength detection element for measuring the level of the output signal, the output of the signal strength detection element coupled to the feedback element to control the configurable impedance in response to the signal level measured by the signal strength detection element, the configurable impedance comprising a varactor having impedance inversely proportional to the measured level of the output signal.

14. The amplifier of claim 3, the signal strength detection element comprising a diode detector.

15. The amplifier of claim 2, further comprising a band-reject filter coupling the output signal to the signal strength detection element.

16. The amplifier of claim 15, the band-reject filter comprising:
a mixer for mixing the output signal with a local oscillator, the local oscillator having a desired frequency; and
a high-pass filter coupled to the output of the mixer.

17. An amplifier for amplifying an input signal to generate an output signal, the amplifier comprising:
a negative feedback element for coupling the output signal to the input signal to generate a modified input signal, the feedback element comprising a configurable impedance;
a gain element for providing gain to the modified input signal, the output of the gain element coupled to the output signal; and
a signal strength detection element for measuring the level of a signal derived from the output signal, the output of the signal strength detection element coupled to the feedback element to control the configurable impedance in response to the signal level measured by the signal strength detection element, the gain element being a transistor, the output signal being the drain-to-source current of the transistor, the input signal being the gate voltage of the transistor, the modified input signal being the gate-to-source voltage of the transistor, the feedback element being an impedance coupling the source of the transistor to a fixed voltage.

18. An amplifier for amplifying an input signal to generate an output signal, the amplifier comprising:
a feedback element for coupling the output signal to the input signal to generate a modified input signal, the feedback element comprising a configurable impedance;
a gain element for providing gain to the modified input signal, the output of the gain element coupled to the output signal; and
a signal strength detection element for measuring the level of the input signal, the output of the signal strength detection element coupled to the feedback element to increase feedback from the output signal to the input signal in response to increased measured input signal level.

19. A method for amplifying an input signal to generate an output signal, the method comprising:
coupling the output signal to the input signal using negative feedback via a configurable impedance, the signals coupled to generate a modified input signal;
providing gain to the modified input signal to generate the output signal;
measuring the level of the output signal; and
controlling the impedance of the configurable impedance to increase feedback from the output signal to the input signal in response to measuring an increased level of the output signal.

20. The method of claim 19, the providing gain to the modified input signal comprising coupling the modified input signal to a gate of a transistor, the gain being between the gate voltage of the transistor and the drain voltage of the transistor, the controlling the impedance of the configurable impedance in response to the measured signal level comprising:
comparing the measured signal level to a first reference voltage, and increasing feedback from the output signal to the input signal via the configurable impedance if the measured signal level exceeds the first reference voltage.

21. A method for amplifying an input signal to generate an output signal, the method comprising:
coupling the output signal to the input signal using negative feedback via a configurable impedance, the signals coupled to generate a modified input signal;
providing gain to the modified input signal to generate the output signal;
measuring the level of the output signal; and
controlling the impedance of the configurable impedance in response to the measured signal level, the controlling the impedance of the configurable impedance in response to the measured signal level comprising:
comparing the measured signal level to a first reference voltage, and increasing feedback from the output signal to the input signal via the configurable impedance if the measured signal level exceeds the first reference voltage, the controlling the impedance of the configurable impedance in response to the measured signal level farther comprising:
comparing the measured signal level to a second reference voltage, and
if the measured level is less than the second reference voltage, decreasing feedback from the output signal to the input signal via the configurable impedance after a predetermined period of time, the second reference voltage being less than the first reference voltage.

22. The method of claim 19, the measuring the level of the output signal comprising:
filtering the output signal to remove a desired signal.

23. A method for amplifying an input signal to generate an output signal, the method comprising:
coupling the output signal to the input signal using negative feedback via a configurable impedance, the signals coupled to generate a modified input signal;
providing gain to the modified input signal to generate the output signal;
measuring the level of a signal derived from the output signal; and
controlling the impedance of the configurable impedance in response to the measured signal level, the measuring the level of a signal derived from the output signal comprising:
filtering the output signal to remove a desired signal; the filtering comprising downconverting the output signal to a baseband signal, and high-pass filtering the baseband signal.

24. An amplifier for amplifying an input signal to generate an output signal, the amplifier comprising:
configurable impedance means for coupling the output signal to the input signal with configurable impedance to generate a modified input signal;
means for providing gain to the modified input signal to generate the output signal;
signal strength detection means for measuring the level of the output signal; and
logic means for controlling the configurable impedance means based on the output of the signal strength detection means to increase feedback from the output signal to the input signal in response to increased measured output signal level.

* * * * *